United States Patent
Ye (10) Patent No.: US 10,503,034 B2
(45) Date of Patent: Dec. 10, 2019

(54) MANUFACTURING METHOD OF A TFT SUBSTRATE AND STRUCTURE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Yanxi Ye, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 103 days.

(21) Appl. No.: 15/578,339

(22) PCT Filed: Nov. 20, 2017

(86) PCT No.: PCT/CN2017/111963
§ 371 (c)(1),
(2) Date: Nov. 30, 2017

(87) PCT Pub. No.: WO2019/061751
PCT Pub. Date: Apr. 4, 2019

(65) Prior Publication Data
US 2019/0219858 A1    Jul. 18, 2019

(30) Foreign Application Priority Data

Sep. 28, 2017 (CN) .......................... 2017 1 0901865

(51) Int. Cl.
*H01L 23/522* (2006.01)
*G02F 1/1343* (2006.01)
(Continued)

(52) U.S. Cl.
CPC ........ *G02F 1/13439* (2013.01); *G02F 1/1368* (2013.01); *G02F 1/13394* (2013.01);
(Continued)

(58) Field of Classification Search
CPC ................. H01L 27/124; H01L 23/528; H01L 21/76877; H01L 21/7685; H01L 21/2855; H01L 27/1259
See application file for complete search history.

(56) References Cited

U.S. PATENT DOCUMENTS

2010/0118236 A1    5/2010  Kim et al.
2017/0170199 A1*   6/2017  Zhang ................. H01L 21/2855
2019/0079617 A1*   3/2019  Li ......................... G06F 3/0412

FOREIGN PATENT DOCUMENTS

CN    105655290    6/2016
CN    106950767    7/2017
CN    106990631    7/2017

* cited by examiner

*Primary Examiner* — Dung A. Le
(74) *Attorney, Agent, or Firm* — Hemiphere Law, PLLC; Zhigang Ma (57) ABSTRACT

The present invention provides a manufacturing method of a TFT substrate and structure. The manufacturing method of the TFT substrate deposit a black photoresist on the second passivation layer (PV2) and patterning to form a main integrated photoresist spacer (61), a sub-photoresist spacer (62) and a black matrix (63), then depositing a transparent conductive film on the integrated main photoresist spacer, the sub-photoresist spacer and the black matrix and patterning to form a pixel electrode (71) and a common electrode (72).

11 Claims, 5 Drawing Sheets

(51) Int. Cl.
*H01L 27/12* (2006.01)
*G02F 1/1362* (2006.01)
*G02F 1/1339* (2006.01)
*G02F 1/1368* (2006.01)

(52) U.S. Cl.
CPC .. G02F 1/134363 (2013.01); G02F 1/136209 (2013.01); G02F 1/136227 (2013.01); H01L 27/1244 (2013.01); H01L 27/1248 (2013.01); H01L 27/1259 (2013.01); *G02F 2001/13396* (2013.01); *G02F 2001/13398* (2013.01); *G02F 2001/136222* (2013.01); *G02F 2201/121* (2013.01); *G02F 2201/123* (2013.01)

MANUFACTURING METHOD OF A TFT SUBSTRATE AND STRUCTURE

RELATED APPLICATIONS

The present application is a National Phase of International Application Number PCT/CN2017/111963, filed on Nov. 20, 2017, and claims the priority of China Application No. 201710901865.9, filed on Sep. 28, 2017.

FIELD OF THE DISCLOSURE

The present invention relates to the field of display technology, and in particular, to a manufacturing method of a TFT substrate and structure.

BACKGROUND

Liquid crystal display (LCD) is referred to as LCD panel, which has many advantages, such as thin body, energy saving, no radiation. It has been widely used, such as LCD TV, smart phone, digital camera, tablet PC, computer screen, or laptop screen, etc., and dominates the field of flat panel displays.

The structure of the liquid crystal panel is usually composed of a color filter (CF) substrate, a thin film transistor array substrate (TFT substrate), and a liquid crystal layer (Liquid Crystal Layer), which controls the rotation of the liquid crystal molecules in the liquid crystal layer by applying a driving voltage to the two glass substrates, and refracts the light of the backlight module to generate a picture.

For the traditional liquid crystal panel, a plurality of color resists for filtering and a black matrix (BM) for light shielding are arranged on the side of the CF substrate, and a special Photo Space (PS) is disposed between TFT substrate and CF substrate to support the cell thickness of the liquid crystal layer. With the development of display technology, there has been a technology that combines BM and PS (Black Photo Spacer, BPS).

BPS 1 tone technology is one of the most cost-effective BPS technology. BPS 1 tone technology is a process technology that the mask used in the BPS process has only one transmittance and only one intensity of light perceived by the corresponding BPS material. However, the conventional BPS 1 tone technology requires the use of organic planarization (PFA) Layer because the conventional BPS 1 tone technology uses an Island structure, which uses two color blocks stacked to act as a main photoresist spacer (Main PS) and a color block to act as a secondary photoresist spacer (Sub PS). Since the difference of the height between the two color blocks and one color block is too large, the difference between the height of the main photoresist spacer and the secondary photoresist spacer will be too large. It needs the organic planarization layer pair to flatten the height of the two-layer color resist.

Figure 1:
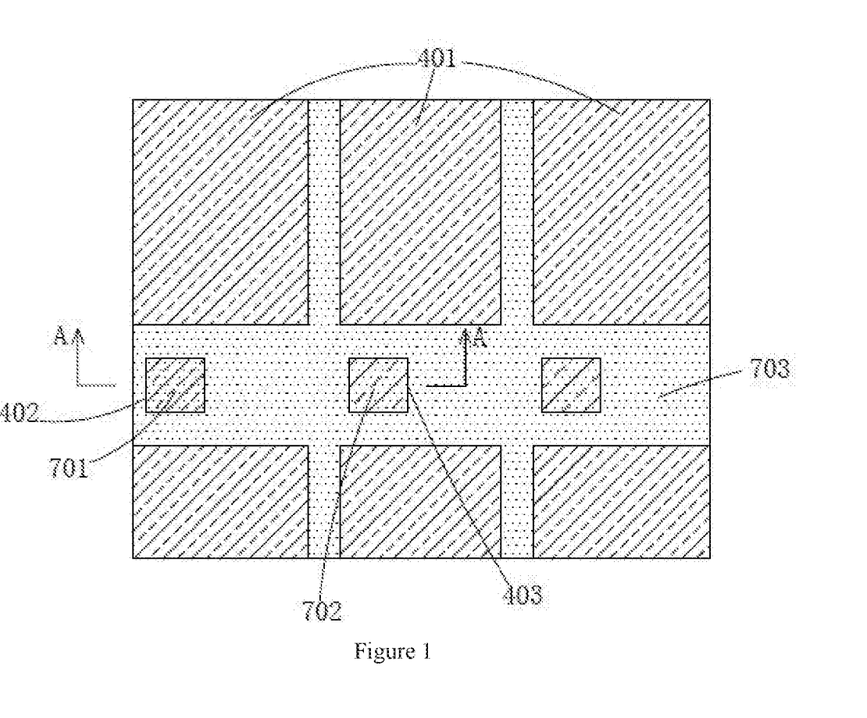
FIG. 1 is a schematic top view of a conventional BPS type TFT substrate with an organic planarization layer omitted.
Figure 2:
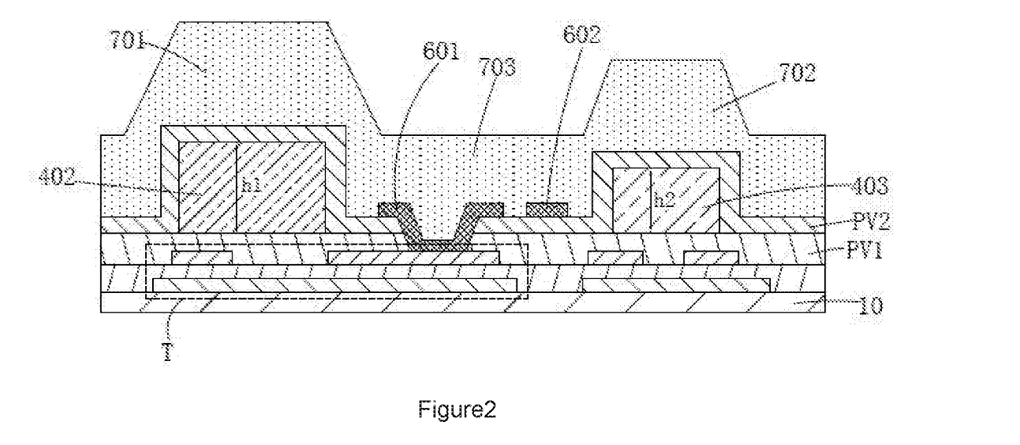
FIG. 2 is a cross-sectional view corresponding to A-A in FIG. 1.

In order to save the costs, eliminating the organic planarization layer of BPS TFT substrate was developed. Referring to FIG. 1 and FIG. 2, the TFT substrate which is omitted with the organic planarization layer use the single-layer of the first island-shaped color resist block 402 to pad the main photoresist spacer 701. It also uses the single-layer of the second island-shaped color resist block 403 to pad the sub-photoresist spacer 701. The second island-shaped color resist block 403 with the sub-photoresist spacer padded up is gray-scale exposed with a slit diffraction type (SLT) mask so that the secondary Shining at the island-shaped color resist block 403 is semi-translucent; The difference between the corresponding main photoresist spacer 701 and the sub-photoresist spacer 702 is the height h1 of the first island-shaped color resist block 402 and the height h2 of the second island-shaped color resist 403. The organic planarization layer may not be used on the color resist layer 401, the first island-shaped color resist block 402 and the second island-shaped color resist block 403, but silicon nitride (SiNx) and the second passivation layer PV2 combined with silicon oxide (SiOx) covers the color resist layer 401, the first island-shaped color resist 402, the second island-shaped color resist 403, and the existing first passivation layer PV1. When manufacturing the BPS TFT substrate, a TFT T and a first passivation layer PV1 covering the TFT T are first formed on the base substrate 10. Then, a color resist is deposited and patterned to form a color resist layer 401, the first island-shaped color resist block 402 and a second island-shaped color resist block 403. Then, depositing a second passivation layer PV2 and performing patterning and depositing a conductive film and etching to form a pixel electrode 601 and a common electrode 602. Finally, the second passivation layer PV2, the pixel electrode 601 and the common electrode 602 to form the integrated main photoresist spacer 701, the sub-photoresist spacer 702 and the black matrix 703.

Figure 3:
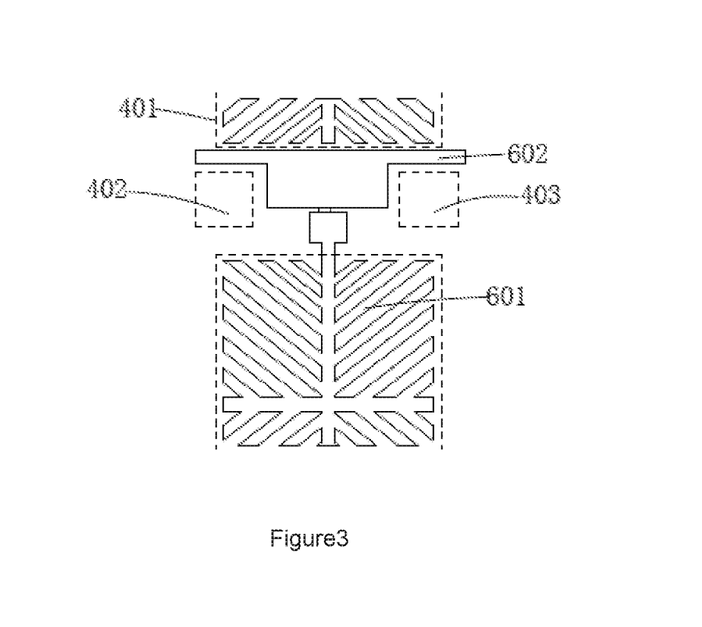
FIG. 3 is a schematic top view showing a short circuit between a pixel electrode and a common electrode of a conventional BPS type TFT substrate with an organic planarization layer omitted.
Figure 4:
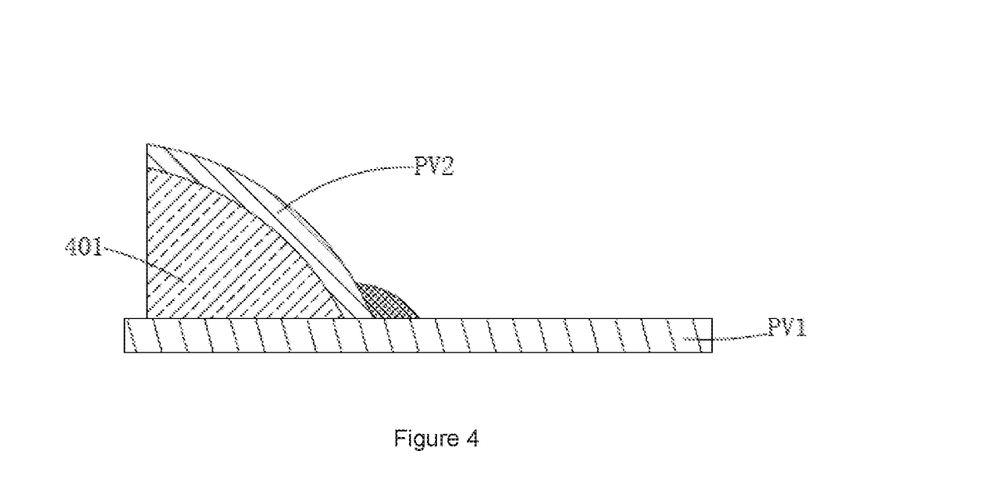
FIG. 4 is a schematic cross-sectional view of a conventional BPS-type TFT substrate with an organic planarization layer omitted which is easy to produce a conductive film etch residue.

To refer FIG. 3 and FIG. 4, there is a problem in the BPS type TFT substrate of this new architecture. Since the color resistance in the area where the black matrix 703 is located is dug, the color resist edge forms a slope. If the slope of the slope is too steep. So the second passivation layer PV2 is completed and the conductive film is further formed, the existence of the ramp causes the conductive film to be etched to be unclean and leave a residue. The remaining conductive film causes the pixel electrode 601 and the common electrode 602 to be short-circuited.

SUMMARY

A purpose of the present invention is to provide a manufacturing method of a TFT substrate, which can avoid the problem of residue of the conductive film due to the steep slope of the color resist edge and prevent short circuit between the pixel electrode and the common electrode.

Another purpose of the present invention is to provide a TFT substrate structure which is capable of preventing a short circuit between a pixel electrode and a common electrode.

To achieve the aforesaid purposes, the present invention provides a manufacturing method of a TFT substrate which comprises:

Step S1, providing a base substrate on the TFT arranged in an array; and depositing a first passivation layer covering all the TFTs;

Step S2, depositing a color resist on the first passivation layer and patterning to form a color resist layer, a first color resist block and a second color resist block, wherein the height of the first color resist block is greater than the height of the second color resist block;

Step S3, depositing a second passivation layer on the first passivation layer, the color resist layer, the first color block and the second color block;

Step S4, depositing a black photoresist on the second passivation layer and patterning to form a main integrated photoresist spacer; a sub-photoresist spacer and a black matrix, and a hole through the black matrix, the second passivation layer and the first passivation layer; wherein the main photoresist spacer is located above the first color resist block; the sub-photoresist spacer is located above the second color resist block, and the hole is completely blocked by a drain of the TFT;

Step S5, depositing a transparent conductive film on the integrated main photoresist spacer, the sub-photoresist spacer and the black matrix and patterning to form a pixel electrode and a common electrode, and the pixel electrode is exposed through the hole connected to the drain of the TFT.

The patterning in step S2 is performed with a slit diffraction type mask.

The color resist deposited in the step S2 comprises a red color resist, a green color resist and a blue color resist.

The material of the transparent conductive film is indium tin oxide.

The material of the first passivation layer and the second passivation layer is silicon nitride, silicon oxide or its mixture.

The first color resist block and the second color resist block are island-like structures.

The present invention also provides a TFT substrate structure which comprises:
a substrate;
TFTs arranged in an array on the substrate;
a first passivation layer covering all of the TFTs;
a color resist layer, a first color block and a second color block disposed on the first passivation layer, wherein a height of the first color block is greater than the height of the second color block;
a second passivation layer covering the first passivation layer, the color resist layer, the first color resist block and the second color resist block;
an integral main photoresist spacer, a sub-photoresist spacer and a black matrix disposed on the second passivation layer, wherein the main photoresist spacer is correspondingly located above the first color resist block, and the sub-photoresist spacer is correspondingly located above the second color resist block; and
a pixel electrode and a common electrode are disposed on the black matrix, wherein the pixel electrode is connected to a drain of the TFT through a hole penetrating the black matrix, the second passivation layer and the first passivation layer; and the hole is completely blocked by the drain of the TFT.

The color resist layer comprises a red color resist, a green color resist and a blue color resist; and the first color resist block and the second color resist block are islands-like structures.

The material of the pixel electrode 71 and the common electrode 72 is indium tin oxide.

The material of the first passivation layer and the second passivation layer is silicon nitride, silicon oxide or its mixture.

The present invention also provides a manufacturing method of a TFT substrate which comprises:

Step S1, providing a substrate and forming TFTs arranged in an array in the substrate, then depositing a first passivation layer covering all the TFTs;

Step S2, depositing a color resist on the first passivation layer and patterning to a color resist layer, a first color resist block and a second color resist block, wherein the height of the first color resist block is greater than the second of the color resist block:

Step S3, depositing a second passivation layer on the first passivation layer, the color resist layer, the first color resist block and the second color resist block;

Step S4, depositing a black photoresist on the second passivation layer and patterning to form a main integrated photoresist spacer, a sub-photoresist spacer and a black matrix, and a hole through the black matrix, the second passivation layer and the first passivation layer, wherein the main photoresist spacer is located above the first color resist block; the sub-photoresist spacer is located above the second color resist block, and the hole is completely blocked by a drain of the TFT;

Step S5, depositing a transparent conductive film on the integrated main photoresist spacer, the sub-photoresist spacer and the black matrix and patterning to form a pixel electrode and a common electrode, and the pixel electrode is exposed through the hole connected to the drain of the TFT.

The patterning in Step S2 is performed with a slit diffraction type mask; and

The color resist deposited in Step S2 comprises a red color resist, a green color resist and a blue color resist;

The material of the transparent conductive film is indium tin oxide;

The material of the first passivation layer and the second passivation layer is silicon nitride, silicon oxide or a combination;

The first color resist block and the second color resist block are island shaped.

The beneficial effects of the present invention are: the manufacturing method of the TFT substrate provided by the present invention is that depositing a black photoresist on the second passivation layer and patterning to form a main integrated photoresist spacer, a sub-photoresist spacer and a black matrix, then depositing a transparent conductive film on the integrated main photoresist spacer, the sub-photoresist spacer and the black matrix and patterning to form a pixel electrode and a common electrode. Because the main integrated photoresist spacer, a sub-photoresist spacer and a black matrix are filled to cover the space where the color resist is excavated in a region that the black matrix is located. The pixel electrode and the common electrode are formed on a flat black matrix to prevent the pixel electrode and the common electrode from being short circuit due to the reason of that the edge of the slope is too steep lead to the problem of residual conductive film etching. The present invention of the TFT substrate structure provides a main integrated photoresist spacer, a sub-photoresist spacer and a black matrix which are disposed on the second passivation layer. A pixel electrode and a common electrode are disposed on the black matrix. Because the main integrated photoresist spacer, a sub-photoresist spacer and a black matrix are filled to cover the space where the color resist is excavated in a region that the black matrix is located. The pixel electrode and the common electrode are formed on a flat black matrix to prevent the pixel electrode and the common electrode from being short circuit due to the reason of that the edge of the slope is too steep lead to the problem of residual conductive film etching.

BRIEF DESCRIPTION OF THE DRAWINGS

For further understanding of the features and technical contents of the present invention, please refer to the following detailed description and accompanying figures of the present invention. However, the figures are for reference only and do not intend to limit the present invention.

In the figures.

DETAILED DESCRIPTION OF PREFERRED EMBODIMENTS

To further illustrate the technical means adopted by the present invention and the effects thereof, the following describes in detail the preferred embodiments of the present invention and the accompanying drawings.

Figure 5:
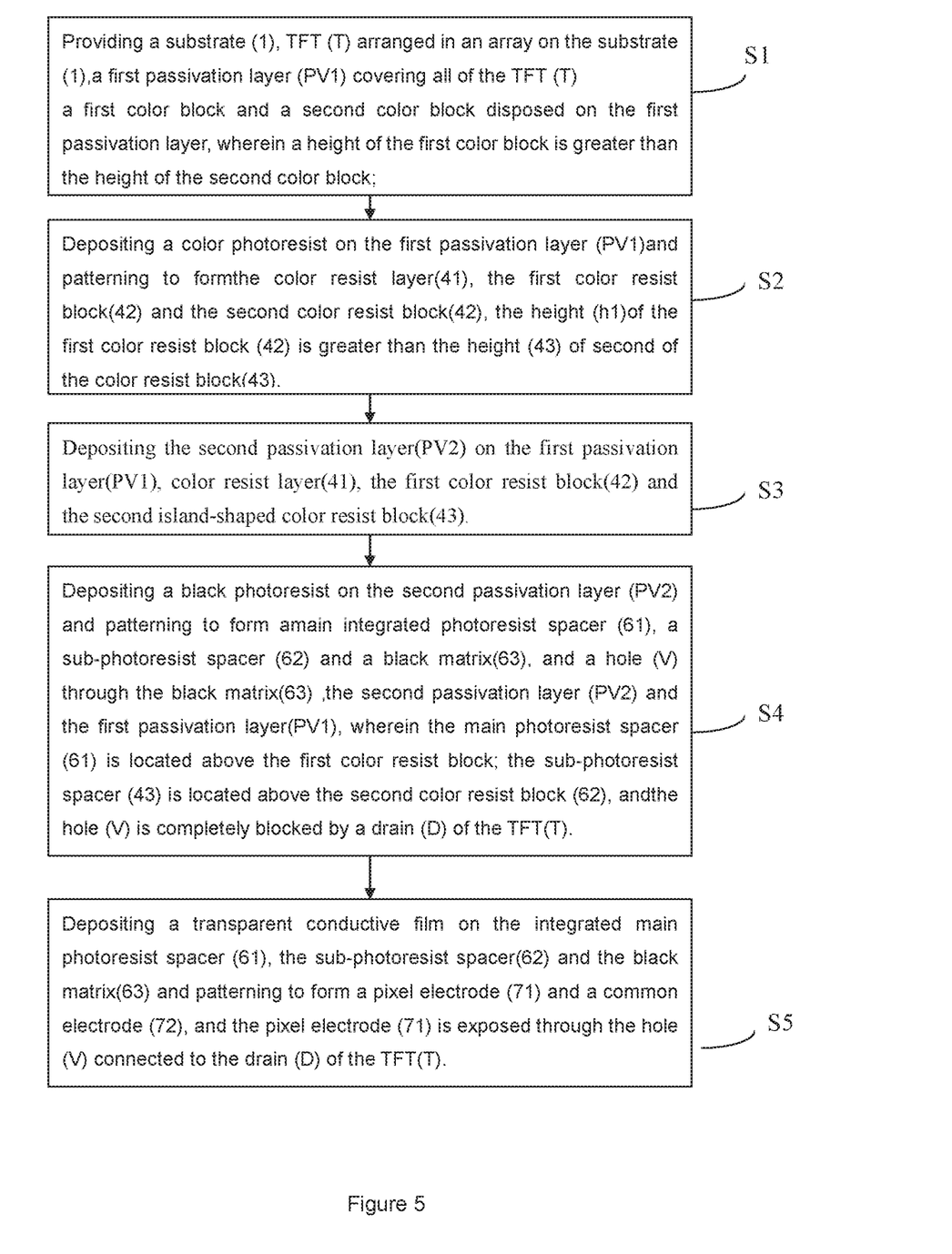
FIG. 5 is a flow chart of a manufacturing method of a TFT substrate of the present invention.
Figure 6:
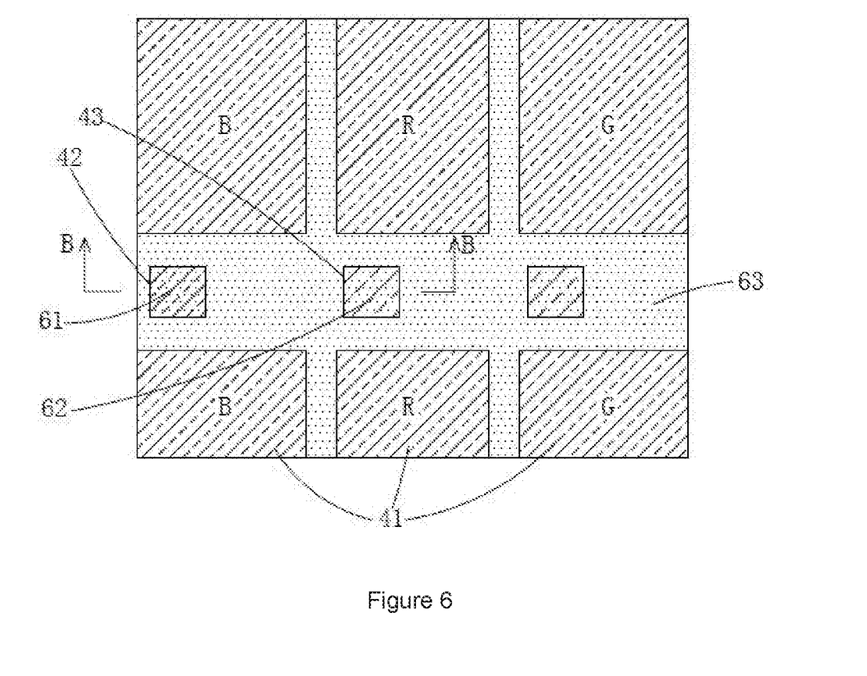
FIG. 6 is a schematic plan view of a color resist layer, a first color resist and a second color resist in a TFT substrate of the present invention.
Figure 7:
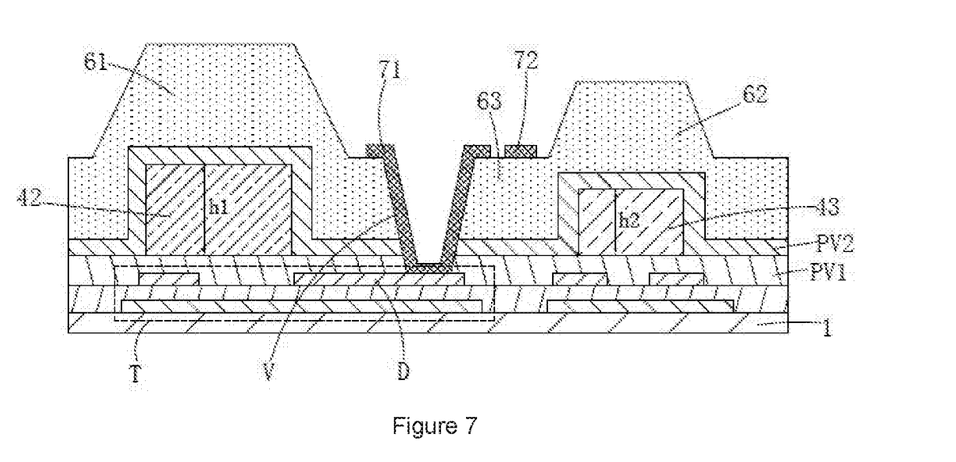
FIG. 7 is a schematic cross-sectional view of B-B shown in FIG. 6 of the TFT substrate of the present invention.

Please refer to FIG. 5 with FIG. 6 and FIG. 7 together, a manufacturing method of a TFT substrate of the present invention comprises the following steps.

Step S1, providing a base substrate 1 on the TFT arranged in an array, and depositing a first passivation layer PV1 covering all the TFTs.

To be specific, the base substrate 1 is preferably as a glass substrate.

TFTs arranged in an array manner can be manufactured on the base substrate 1 by using the existing conventional process, and will not be described more here. The TFT comprises a gate, a gate insulating layer, a semiconductor active layer, an interlayer insulating layer, a source and a drain D, and the like, which is the same as the prior art and will not be described more here.

The material of the first passivation layer PV1 is silicon nitride (SiNx), silicon oxide (SiOx) or its mixture.

Step S2, depositing a color resist on the first passivation layer PV1 and patterning to form a color resist layer 41, a island-like structures of first color resist block 42 and a island-like structures of second color resist block 43, and the height h1 of the first color resist block 42 is greater than the height h2 of the second color resist block 43;

To be specific, the color resist deposited in the step S2 comprises a red color resist R, a green color resist G and a blue color resist B.

The patterning in step S2 is performed with a slit diffraction type mask. The slit diffraction type mask can perform grayscale exposure such that the light irradiated at the second color resist 43 is semi-translucent and the intensity of light illuminated at the first color resist 42 is greater than the intensity of the light at the second color resist 43. So that the height h1 of the first color-resisting block 42 is greater than the height h2 of the second color-resisting block 43, but the difference between the two is not great.

Step S3, depositing a second passivation layer PV2 on the first passivation layer PV1, the color resist layer 41, the first color block 42 and the second color block 43.

To be specific; the material of the second passivation PV2 is SiNx, SiOx or its mixture.

Step S4; the BPS technology could deposit a black photoresist on the second passivation layer PV2 and patterning to form a main integrated photoresist spacer 61, a sub-photoresist spacer 62, a black matrix 63; and a hole V through the black matrix 63, the second passivation layer PV2 and the first passivation layer PV1, wherein the main photoresist spacer 61 is located above the first color resist block 42, and the sub-photoresist spacer 62 is located above the second color resist block 43.

Because the height h1 of the first color resist block 42 formed in step S2 is greater than the height h2 of the second color resist block 43, the main integrated photoresist spacer 61 is padded by the first color resist block 42, and the sub-photoresist spacer 62 is padded by the second color resist block 43. So that there is a corresponding difference between the main photoresist spacer 61 and the sub-photoresist spacer 62, which is the same as the difference between the height h1 of the first color resist block 42 and the height h2 of the second color resist block 43.

It is worth to be mentioned that the hole V is located above the drain of the TFTT and is completely blocked by the drain D of the TFTT. The purpose of this design is to make up the light leakage risk of the black matrix 63 by utilizing the metal light-shielding property of the drain D of the TFTT.

Step S5, depositing a transparent conductive film on the integrated main photoresist spacer 61, the sub-photoresist spacer 62 and the black matrix 63 and patterning to form a pixel electrode 71 and a common electrode 72, and the pixel electrode 71 is exposed through the hole V connected to the drain D of the TFT.

Specifically, the material of the transparent conductive film is preferably as indium tin oxide (ITO).

The manufacturing method of the TFT substrate can deposit a black photoresist on the second passivation layer PV2 and patterning to form a main integrated photoresist spacer 61, a sub-photoresist spacer 62 and a black matrix 63, then depositing a transparent conductive film on the integrated main photoresist spacer 61, the sub-photoresist spacer 62 and the black matrix 63 and patterning to form a pixel electrode 71 and a common electrode 72. Because the main integrated photoresist spacer 61, a sub-photoresist spacer 62 and a black matrix 63 are filled to cover the space where the color resist is excavated in a region that the black matrix is located. The pixel electrode 71 and the common electrode 72 are formed on a flat black matrix 63, as shown in the FIG. 8, to prevent the pixel electrode 71 and the common electrode 72 from being short circuit due to the reason of that the edge of the slope is too steep lead to the problem of residual conductive film etching. Besides, the hole V is formed above the drain D of the TFTT, and the metal light-shielding performance of the drain D of the TFT T can compensate for the light leakage risk of the black matrix 63 due to hole V.

Figure 8:
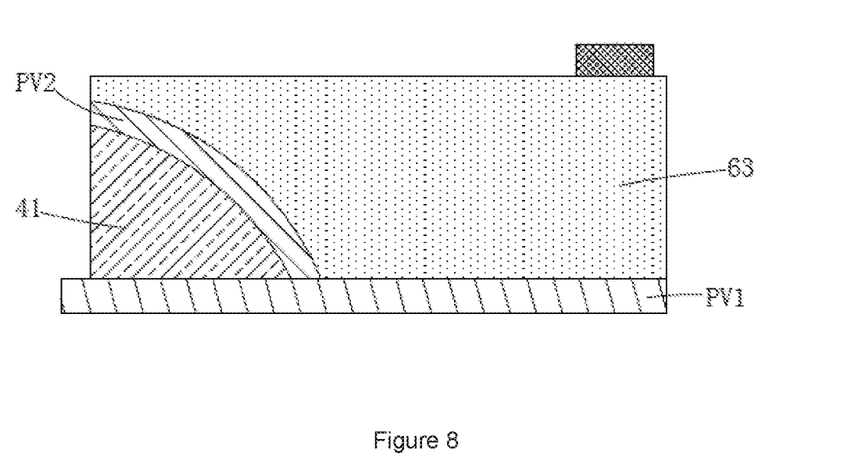
FIG. 8 is a schematic cross-sectional view showing that the TFT substrate of the present invention which can prevent the residual conductive film from being etched.

Please refer to FIG. 6 and FIG. 8 together, a TFT substrate structure of the present invention comprises:

a substrate 1;

TFTs arranged in an array on the substrate 1;

a first passivation layer PV1 covering all of the TFTs;

a color resist layer 41, a island-like structures of first color block 42 and a island-like structures of second color block 43 disposed on the first passivation layer PV1, wherein a height h1 of the first color block 42 is greater than the height h2 of the second color block 43;

a second passivation layer PV2 covering the first passivation layer PV1, the color resist layer 41, the first color resist block 42 and the second color resist block 43;

an integral main photoresist spacer 61, a sub-photoresist spacer 62 and a black matrix 63 disposed on the second passivation layer PV2, wherein the first main photoresist spacer 61 is correspondingly located above the first color resist block 42, and the sub-photoresist spacer 62 is correspondingly located above the second color resist block 43; and a pixel electrode 71 and a common electrode 72 are disposed on the black matrix 63, wherein the pixel electrode 71 is connected to a drain Dof the TFT through a hole V penetrating the black matrix 63, the second passivation layer PV2 and the first passivation layer PV1; and the hole is completely blocked by the drain D of the TFT.

To be specific, the base substrate 1 is preferably as a glass substrate.

The material of the first passivation layer PV1 is silicon nitride (SiNx), silicon oxide (SiOx) or its mixture.

The color resist layer 41 comprises a red color resist R, a green color resist G and a blue color resist B.

The material of the pixel electrode 71 and the common electrode 72 is indium tin oxide.

Because the second passivation layer PV2 of the TFT substrate structure of the present invention deposits a transparent conductive film on the integrated main photoresist spacer 61, the sub-photoresist spacer 62 and the black matrix 63 and form the pixel electrode 71 and the common electrode 72 on the black matrix 63. Because the main integrated photoresist spacer 61, a sub-photoresist spacer 62 and a black matrix 63 are filled to cover the space where the color resist is excavated in a region that the black matrix is located. The pixel electrode 71 and the common electrode 72 are formed on a flat black matrix 63 to prevent the pixel electrode 71 and the common electrode 72 from being short circuit due to the reason of that the edge of the slope is too steep lead to the problem of residual conductive film etching.

It is worth to mention that the hole V is located above the drain D of the TFTT and is completely blocked by the drain D of the TFTT. The purpose of this design is to make up the light leakage risk of the black matrix 63 by utilizing the metal light-shielding property of the drain D of the TFTT.

In summary, the manufacturing method of the TFT substrate deposit a black photoresist on the second passivation layer and patterning to form a main integrated photoresist spacer, a sub-photoresist spacer and a black matrix, then depositing a transparent conductive film on the integrated main photoresist spacer, the sub-photoresist spacer and the black matrix and patterning to form a pixel electrode and a common electrode. Because the main integrated photoresist spacer, a sub-photoresist spacer and a black matrix are filled to cover the space where the color resist is excavated in a region that the black matrix is located. The pixel electrode and the common electrode are formed on a flat black matrix to prevent the pixel electrode and the common electrode from being short circuit due to the reason of that the edge of the slope is too steep lead to the problem of residual conductive film etching.

The second passivation layer of the TFT substrate structure of the present invention deposits a transparent conductive film on the integrated main photoresist spacer, the sub-photoresist spacer and the black matrix and form the pixel electrode and the common electrode on the black matrix. Because the main integrated photoresist spacer, a sub-photoresist spacer and a black matrix are filled to cover the space where the color resist is excavated in a region that the black matrix is located. The pixel electrode 71 and the common electrode are formed on a flat black matrix to prevent the pixel electrode and the common electrode from being short circuit due to the reason of that the edge of the slope is too steep lead to the problem of residual conductive film etching.

In view of the above, those skilled in the art can make various other corresponding changes and modifications according to the technical solutions of the present invention, and all such changes and modifications shall fall within the protection scope of the claims of the present invention.

What is claimed is:

1. A manufacturing method of a TFT substrate, comprising:
    Step S1, providing a base substrate on the TFT arranged in an array, and depositing a first passivation layer covering all the TFTs;
    Step S2, depositing a color resist on the first passivation layer and patterning to form a color resist layer, a first color resist block and a second color resist block, wherein the height of the first color resist block is greater than the height of the second color resist block;
    Step S3, depositing a second passivation layer on the first passivation layer, the color resist layer, the first color block and the second color block;
    Step S4, depositing a black photoresist on the second passivation layer and patterning to form a main integrated photoresist spacer, a sub-photoresist spacer and a black matrix, and a hole through the black matrix, the second passivation layer and the first passivation layer; wherein the main photoresist spacer is located above the first color resist block, the sub-photoresist spacer is located above the second color resist block; and the hole is completely blocked by a drain of the TFT;
    Step S5, depositing a transparent conductive film on the integrated main photoresist spacer, the sub-photoresist spacer and the black matrix and patterning to form a pixel electrode and a common electrode, and the pixel electrode is exposed through the hole connected to the drain of the TFT.

2. The manufacturing method of a TFT substrate according to claim 1, wherein the patterning in step S2 is performed with a slit diffraction type mask.

3. The manufacturing method of a TFT substrate according to claim 1, wherein the color resist deposited in the step S2 comprises a red color resist, a green color resist and a blue color resist.

4. The manufacturing method of a TFT substrate according to claim 1, wherein the material of the transparent conductive film is indium tin oxide.

5. The manufacturing method according to claim 1, wherein the material of the first passivation layer and the second passivation layer is silicon nitride, silicon oxide or its mixture.

6. The manufacturing method of a TFT substrate according to claim 1, wherein the first color resist block and the second color resist block are island-like structures.

7. A TFT substrate structure comprising:
    a substrate;
    TFTs arranged in an array on the substrate;
    a first passivation layer covering all of the TFTs;
    a color resist layer, a first color block and a second color block disposed on the first passivation layer, wherein a height of the first color block is greater than the height of the second color block;
    a second passivation layer covering the first passivation layer, the color resist layer, the first color resist block and the second color resist block;
    an integral main photoresist spacer, a sub-photoresist spacer and a black matrix disposed on the second passivation layer, wherein the main photoresist spacer is correspondingly located above the first color resist block, and the sub-photoresist spacer is correspondingly located above the second color resist block; and a pixel electrode and a common electrode disposed on the black matrix, wherein the pixel electrode is connected to a drain of the TFT through a hole penetrating the black matrix, the second passivation layer and the first passivation layer; and the hole is completely blocked by the drain of the TFT.

8. The TFT substrate structure according to claim 7, wherein the color resist layer comprises a red color resist, a green color resist and a blue color resist; and the first color resist block and the second color resist block are islands-like structures.

9. The TFT substrate structure according to claim 7, wherein the material of the pixel electrode and the common electrode is indium tin oxide.

10. The TFT substrate structure according to claim 7, wherein the material of the first passivation layer and the second passivation layer is silicon nitride, silicon oxide or its mixture.

11. A manufacturing method of a TFT substrate comprising:

Step S1, providing a substrate, forming TFTs arranged in an array in the substrate, and depositing a first passivation layer covering all the TFTs;

Step S2, depositing a color resist on the first passivation layer and patterning to a color resist layer, a first color resist block and a second color resist block, wherein the height of the first color resist block is greater than the second of the color resist block;

Step S3, depositing a second passivation layer on the first passivation layer, the color resist layer, the first color resist block and the second color resist block;

Step S4, depositing a black photoresist on the second passivation layer and patterning to form a main integrated photoresist spacer, a sub-photoresist spacer and a black matrix, and a hole through the black matrix, the second passivation layer and the first passivation layer; wherein the main photoresist spacer is located above the first color resist block, the sub-photoresist spacer is located above the second color resist block; the hole is completely blocked by a drain of the TFT;

Step S5, depositing a transparent conductive film on the integrated main photoresist spacer, the sub-photoresist spacer and the black matrix and patterning to form a pixel electrode and a common electrode, and the pixel electrode is exposed through the hole connected to the drain of the TFT;

wherein, the patterning in Step S2 is performed with a slit diffraction type mask; and the color resist deposited in Step S2 comprises a red color resist, a green color resist and a blue color resist;

wherein, the material of the transparent conductive film is indium tin oxide;

wherein the material of the first passivation layer and the second passivation layer is silicon nitride, silicon oxide or a combination;

wherein, the first color resist block and the second color resist block are island shaped.

* * * * *